United States Patent [19]
Pfiester

[11] Patent Number: 4,786,611
[45] Date of Patent: Nov. 22, 1988

[54] ADJUSTING THRESHOLD VOLTAGES BY DIFFUSION THROUGH REFRACTORY METAL SILICIDES

[75] Inventor: James R. Pfiester, Austin, Tex.

[73] Assignee: Motorola, Inc., Schaumburg, Ill.

[21] Appl. No.: 109,636

[22] Filed: Oct. 19, 1987

[51] Int. Cl.[4] ......................................... H01L 21/225
[52] U.S. Cl. ....................................... 437/45; 437/40; 437/56; 437/162; 437/200; 148/DIG. 147
[58] Field of Search ...................... 437/40, 41, 57, 56, 437/200, 45, 162; 357/59, 42; 148/DIG. 147

[56] References Cited

U.S. PATENT DOCUMENTS

| | | | |
|---|---|---|---|
| 4,364,166 | 12/1982 | Crowder et al. | 437/200 |
| 4,450,620 | 5/1984 | Fuls et al. | 437/45 |
| 4,463,491 | 8/1984 | Goldman et al. | 437/200 |
| 4,555,842 | 12/1985 | Levinstein et al. | 437/34 |
| 4,703,552 | 11/1987 | Baldi et al. | 437/45 |
| 4,740,479 | 4/1988 | Neppl et al. | 437/34 |

OTHER PUBLICATIONS

S. K. Tiku, *Electronics Letters*, 7th Nov. 1985, vol. 21, No. 23, pp. 1091–1093.

S. M. Sze, *VLSI Technology*, McGraw Hill, 1983, pp. 468–470.

L. C. Parrillo et al., "A Fine-Line CMOS Technology that Uses P+ Polysilcon/Silicide Gates for NMOS and PMOS Devices," *IEDM Technical Digest*, 1984, pp. 418–421.

James R. Pfiester et al., "E/D CMOS—A High Speed VLSI Technology," 1983 *Symposium on VLSI Technology: Digest of Technical Papers*, 1983, pp. 44–45.

Primary Examiner—Brian E. Hearn
Assistant Examiner—T. N. Quach
Attorney, Agent, or Firm—John A. Fisher; Jeffrey V. Myers

[57] ABSTRACT

Adjusting field effect transistor (FET) threshold voltage ($V_T$) by diffusing impurities in polysilicon gates through a refractory metal silicide. Dopants of different conductivities may be cross-diffused. This adjustment can be made relatively late in the fabrication of the wafers to provide a quick turn around time of custom circuits, gate arrays and application specific integrated circuits (ASICs). A masking step selectively provides blocking elements to prevent the diffusion from occurring in certain of the FETs.

19 Claims, 3 Drawing Sheets

ADJUSTING THRESHOLD VOLTAGES BY DIFFUSION THROUGH REFRACTORY METAL SILICIDES

FIELD OF THE INVENTION

The invention relates to the fabrication of field effect transistors (FETs), and more particularly relates to the fabrication of FETs by processes that permit the gate threshold voltage to be adjusted relatively late in the fabrication process.

BACKGROUND OF THE INVENTION

In the fabrication of specialized integrated circuits (ICs) such as custom ICs, gate arrays, or application specific integrated circuits (ASICs), it is an advantage to be able to build such circuits rapidly and accurately for the customer. Typically, the custom IC or ASIC customer has a need for the circuit to be delivered quickly. However, since the fabrication of a typical IC may take weeks, there is a need to shorten the time it takes to deliver such circuits to the custom IC or ASIC customer. That is, it is necessary to reduce the cycle time from the custom or ASIC order and the delivery of the finished product to the customer.

The ASIC cycle time can be reduced in many ways. One technique is to build and have on hand unfinished ICs that can be customized by changes in the later processing steps so that the customer need not wait for the performance of the earlier processing steps. This procedure is commonly followed in the formation of the metallization or interconnect layer which joins various preformed circuit elements such as field effect transistors (FETs), capacitors and resistors. In the fabrication of custom gate arrays, this procedure is particularly common.

Heretofore the basic characteristics of the FETs in the partially finished IC are set early in the process since the primary working elements of the FET, the source, drain and channel, are formed within the semiconductor substrate. Usually, the substrate elements are covered by multiple layers of dielectric or conductive material and the elements buried thereby cannot be changed, except with great difficulty.

As very large scale integration (VLSI) processes are used to make FETs, the channel lengths become shorter and gate oxides become thinner, and a higher doping level under the gate in the channel region is required to provide the desired threshold and subthreshold voltage characteristics. Employing a heavily doped substrate will provide this higher channel doping level; however, such a condition increases the back-gate bias sensitivity of the threshold voltage and tends to increase the source/drain-to-substrate capacitances as well. A shallow ion implant is widely used to set the desired doping level in the channel region without increasing the background substrate doping level. By this technique, the threshold sensitivity to back-gate bias can be minimized while still having the desired high surface concentration. See, for example, S. M. Sze, *VLSI Technology*, McGraw-Hill, 1983, pp. 468–470.

However, as explained, the partially completed ICs typically have the sources, channels, drains, and at least the polysilicon gate layer in place before customization begins. At this point in the process, however, it would be difficult to perform a channel implant to affect the threshold voltage of the device. Thus, it would be advantageous if a process could be discovered by which the threshold voltage of a FET could be adjusted relatively late in the fabrication process for custom and application specific ICs. In summary, the $V_T$ adjustment is usually performed by ion implantation prior to gate definition, which causes a longer turn around time for processing custom circuits after the order is received.

It is known in the art that the threshold voltage, $V_T$, of a FET can be modified by using a semiconductor material as the gate material and varying the doping concentration of the gate. For example, polycrystalline silicon (polysilicon) doped with n-type or p-type impurities could be used. Refractory metals, such as molybdenum, titanium, tungsten, and tantalum and their silicides have been used in conjunction with polysilicon or alone to reduce the resistance of the gate materials. The technique of combining a refractory metal silicide on top of doped polysilicon, sometimes called polycide, has the advantage of preserving the well-understood polysilicon/$SiO_2$ interface while lowering the overall sheet resistance of the polycide. It is also known that employing certain silicides directly on the gate oxide can result in larger work functions than using $n^+$-doped polysilicon alone, and that corresponding adjustments in the channel-doping procedure may be required.

It is also known that the dopants in polysilicon, such as boron and arsenic, can diffuse extremely rapidly in some refractory metal silicides that are contacted with the polysilicon during anneal. The dopants may subsequently diffuse out of the silicide into adjacent polysilicon where the concentration of that dopant is relatively less. It is also known that if such rapid diffusion occurs in a polysilicon gate line that the threshold voltages of the device can be adjusted to compensate for the effect. See, for example, L. C. Parrillo, et al., "A Fine-Line CMOS Technology that Uses $p^+$ Polysilicon/Silicide Gates for NMOS and PMOS Devices," *IEDM Technical Digest*, 1984, pp. 418–421.

SUMMARY OF THE INVENTION

Accordingly, it is an object of the present invention to provide a means for adjusting the threshold voltage of a field effect transistor relatively late in the fabrication process.

Another object of the invention is to provide a means for adjusting the $V_T$ of FETs in an integrated circuit that can be applied selectively to the FETs in the circuit.

It is another object of the present invention to provide a method and structure for adjusting the $V_T$ of FETs that employs known process steps.

In carrying out these and other objects of the invention, there is provided, in one form, a process for modifying the performance characteristics of field effect transistors (FETs) late in a fabrication process of the FET that involves first providing a monocrystalline silicon substrate having partially constructed FETs formed thereon, where each FET has a source, a drain, a channel separating the source and drain, and a dielectric layer over at least the channel. Next, a pattern of polycrystalline silicon gates is formed on the dielectric layer positioned over the channels of the FETs. A first portion of the pattern is doped with an impurity of a first conductivity type, while a second portion of the pattern is doped with an impurity of a second conductivity type. The joining of the first portions and second portions of the pattern occur at junctions. The polysilicon pattern and the junctions not covered by the blocking elements are next covered with a refractory metal silicide. Then an anneal step is performed to cause diffusion of the impurities in the first and second portions of the polysilicon pattern through the refractory metal silicide to the portion of the pattern having the opposite impurities.

BRIEF DESCRIPTION OF THE DRAWINGS

It will be appreciated that the cross-section illustrations herein, FIGS. 1-6, are not to scale and that some thicknesses may be exaggerated for clarity.

DETAILED DESCRIPTION OF THE INVENTION

The purpose of the present invention is to provide a threshold voltage, $V_T$, adjustment mask for n-channel or p-channel "metal"-oxide-semiconductor (MOS) FETs after the source/drain definition is performed for custom circuits such as ASICs or gate arrays using the fast diffusion properties of arsenic or boron in silicides. An advantage of the invention is that the mask is used late in processing prior to the formation of the refractory metal silicide, or salicide, on the gates and source/-drains of the FETs. After a low temperature oxide (LTO) or other dielectric material is provided, a photoresist mask is used to define blocking elements or blocks to prevent the diffusion where it is not needed or desired. The selective silicide strap on the polysilicon gates allow lateral dopant diffusion to counterdope the $n^+$ or $p^+$ poly gate areas. To begin with, the $n^+$ and $p^+$ gates are formed by the ion implantation of undoped polysilicon with their respective source/drain ion implantation.

Figure 1:
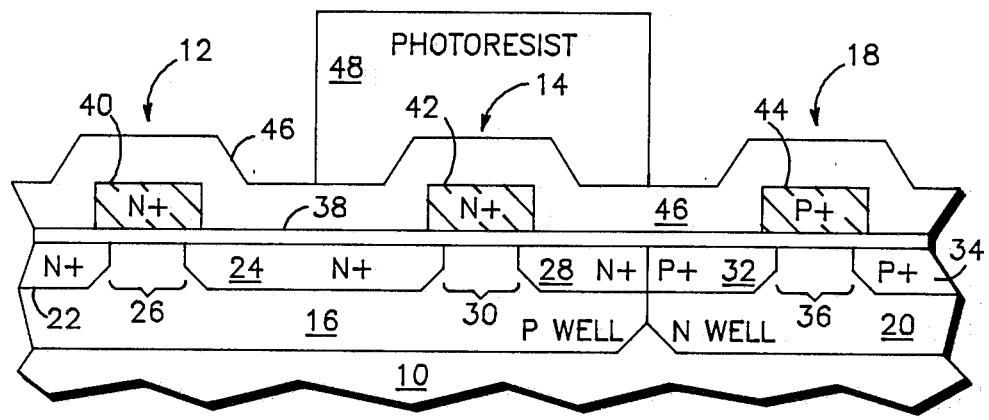
FIG. 1 is a cross-section schematic illustration of three field effect transistors under construction after a dielectric material layer has been formed over the pattern of polysilicon.

Shown in FIG. 1 is a monocrystalline silicon substrate 10, which may also be polycrystalline silicon, having partially constructed n-channel FETs 12 and 14 thereon in p-well 16 and partially constructed p-channel FETs 18 thereon in n-well 20. FET 12 has source 22 separated from drain region 24 by channel 26. Drain region 24 also serves as the source region for FET 14, separated from drain 28 by channel 30. Further, p-channel FET 18 has source region 32 and drain region 34 separated by channel 36.

Figure 2:
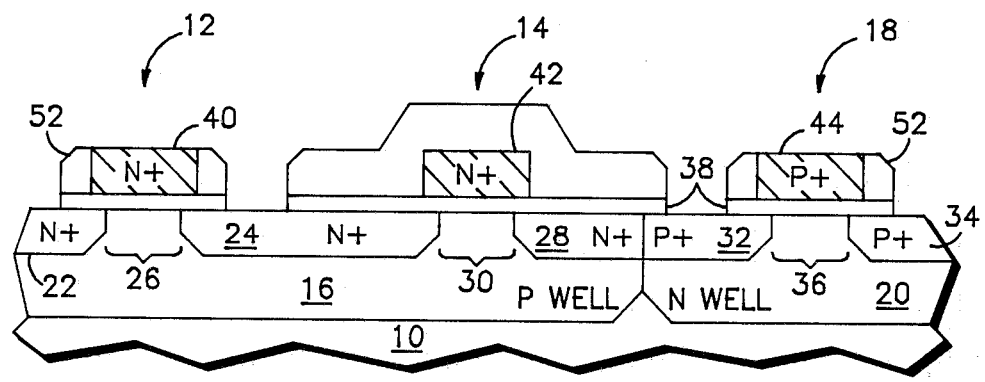
FIG. 2 is an illustration of the FET under construction from FIG. 1 after the dielectric material layer has been patterned.
Figure 3:
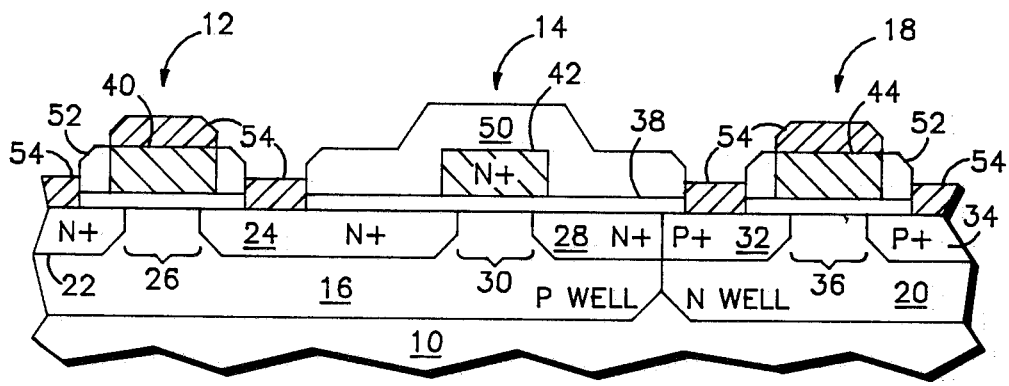
FIG. 3 is an illustration of the FET of FIG. 2 after a refractory metal silicide has been formed only on exposed polysilicon and monocrystalline silicon.

It will be appreciated that isolation or field oxide regions are not shown in FIGS. 1 through 3 for clarity.

Over at least channels 26, 30 and 36 is a dielectric layer 38, which covers the substrate 10. Dielectric layer 38 is typically a thin silicon dioxide layer used as the gate dielectric. On dielectric layer 38 is a conductive material pattern consisting of $n^+$ gates 40 and 42 and $p^+$ gate 44. These gates may or may not be connected to one another at part of the circuit not shown. As shown in FIG. 1, over gates 40, 42 and 44 is a uniform dielectric material layer 46 which will form the blocking elements. The wafers would be stockpiled in the form shown in FIG. 1, except that photoresist pattern 48 would not be present.

Photoresist pattern 48 is then formed over selected junctions, to be further illustrated later, whereas the remainder of the dielectric is exposed for etch, the results of which are shown in FIG. 2. Dielectric material layer 46 may be low temperature oxide (LTO) or some other uniform material. Silicon nitride or a combination of silicon oxide and silicon nitride may be used.

Shown in FIG. 2 are the results of the etch of dielectric material layer 46. The etch leaves block 50, and if an anisotropic etch is performed, such as a reactive ion etch (RIE), sidewalls 52 are left on the sides of exposed gates 40 and 44, while gate 42 is covered by blocking element 50. The sidewalls 52 are optional, but may help separate the subsequent silicide on the gate from the silicide that forms on the source and/or drain regions. Additionally, it should be noted that the process of the present invention is compatible with processes to form lightly doped drains (LDDs) and the sidewalls 52 often used in the fabrication of the LDDs. Note that after the etch, the monocrystalline substrate 10 is exposed through openings over source 22, drain/source 24, source 32 and drain 34, and gates 40 and 44 are exposed polysilicon regions.

Next, a selective refractory metal silicide formation is performed, which is known to selectively form a refractory metal silicide layer 54 on the noted exposed mono- and polycrystalline silicon areas, but not on the sidewalls 52 nor the block 50. Typically, the metal is formed on the wafer in a uniform layer, the layer is reacted with the silicon in a high temperature step, and the unreacted metal on the non-silicon surfaces is washed away. The refractory metal in the silicide or salicide may be titanium, tantalum, molybdenum and tungsten. The $n^+$ impurity in gate 40, such as arsenic, now tends to rapidly diffuse through silicide 54, and similarly, the $p^+$ impurity in gate 44, such as boron, will rapidly diffuse through its silicide 54 during thermal anneal cycles. If gates 40 and 44 happen to be connected together, and there are no blocking elements 50 between them, then the diffusing impurities will diffuse into the opposite gates, that is, the arsenic will diffuse into gate 44 and the boron will diffuse into gate 40, and eventually, the entire gate line will reach a steady state doping concentration of either n or p type. This "redoping" via the silicide strap 54 adjusts the $V_T$ of both FETs 12 and 18 and thus provides a late customizing feature for the fabrication of gate arrays and ASICs. The combination of the silicide strap 54 and the polysilicon is sometimes called polycide.

Alternatively, if a gate is covered by a blocking element 50, such as gate 42, or if a blocking element 50 is at some intermediate point on both sides of a gate, then the dopant diffusion redistribution will not affect that particular gate. This procedure will affect how the contacts to the gates are patterned. For example, for those gates where the impurity is not redistributed, a separate contact will have to be made to the p+ and n+ gates where their junctions form a PN diode.

In another embodiment, however, it is recognized that in the formation of the silicide, such as a titanium silicide, for example, a blanket layer of titanium is formed over the surface of the wafer. As described above, typically, the titanium is washed off except where it is reacted with polysilicon to form the silicide. However, the titanium could be retained, such as in the form of titanium nitride, to form a bridge over oxide regions to connect p+ and n+ doped polysilicon regions that would not provide a rapid diffusion conduit.

Figure 4:
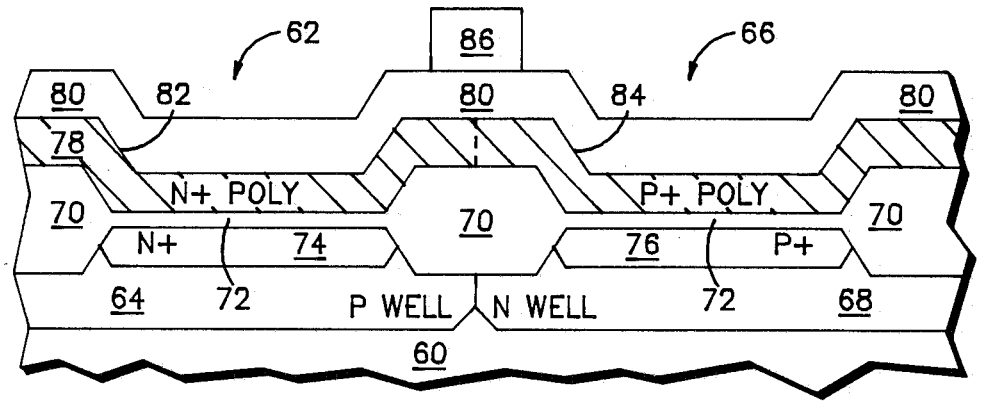
FIG. 4 is a cross-section schematic illustration of another view of the FETs under construction in FIG. 1, but at right angles thereto.
Figure 5:
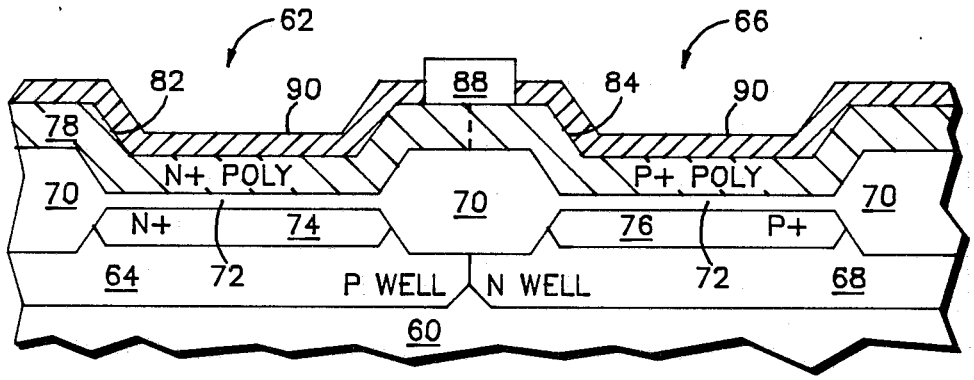
FIG. 5 is an illustration of the FETs under construction in FIG. 4 after the dielectric layer has been patterned and the refractory metal silicide selectively deposited to show how the patterned oxide may block diffusion.
Figure 6:
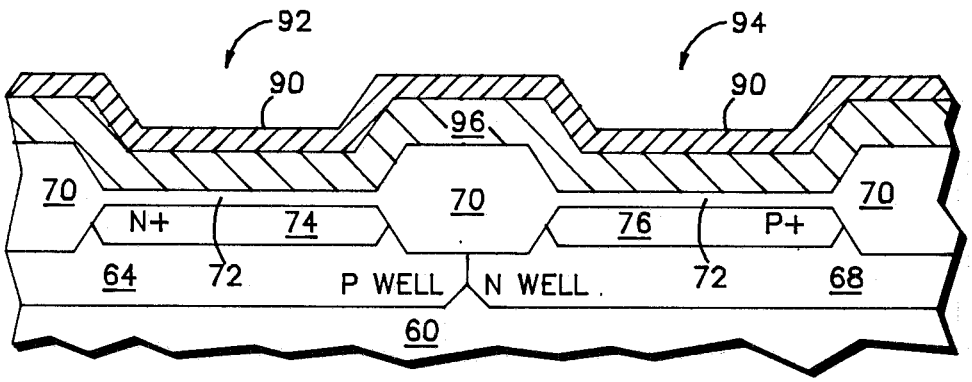
FIG. 6 is a cross-sectional illustration of the FETs under construction similar to FIG. 5, except that in this part of the circuit the diffusion block is not present.

FIGS. 4 through 6 depict another view of the inventive process applied to FETs. In these FIGS., the direction of view is parallel to the carrier path, and at right angles to the orientation of the FETs in FIGS. 1 through 3. Again, a semiconductor substrate 60 is provided that has a n-channel FET 62 under construction in a p-well 64 and a p-channel FET 66 under construction in a n-well 68. In these illustrations, field oxide regions 70 are shown, and a thin dielectric layer 72 or gate oxide layer is also present. A n+ source or drain region 74 is shown for n-channel FET 62 and a p+ source or drain region 76 is shown for the p-channel FET 66.

A uniform layer of polycrystalline silicon 78 is formed over this structure, and in turn a dielectric layer 80 is formed over the poly layer. The wafers may be stockpiled in this form prior to a gate array or ASIC order, for example. Polysilicon layer 78 has a first region 82 of one conductivity type, such as n+ due to arsenic impurities, and a second region 84 of a second conductivity type, such as p+ due to boron impurities. When a particular custom order is desired to be implemented, a photoresist pattern 86 is provided to define the future blocking elements, as shown in FIG. 4.

After the etch, which may or may not be anisotropic, block 88 is left as shown in FIG. 5, and a refractory metal silicide 80 is formed thereon as shown. Blocking element 88 effectively prevents the impurities from first n+ poly region 82 and second p+ poly region 84 from diffusing through silicide layer 90 to the oppositely doped poly regions. Thus, the $V_T$ of FETs 62 and 66 are not adjusted.

However, shown in FIG. 6 are n-channel FET 82 and p-channel FET 94 having some common reference numerals to similar features in the immediate preceding discussion. In this case, no blocking element 88 is present, and the impurities or dopants from the first and second poly regions rapidly cross-diffused by means of the silicide layer 90 to give a uniform doped poly layer, which may be n or p doped.

Figure 7:
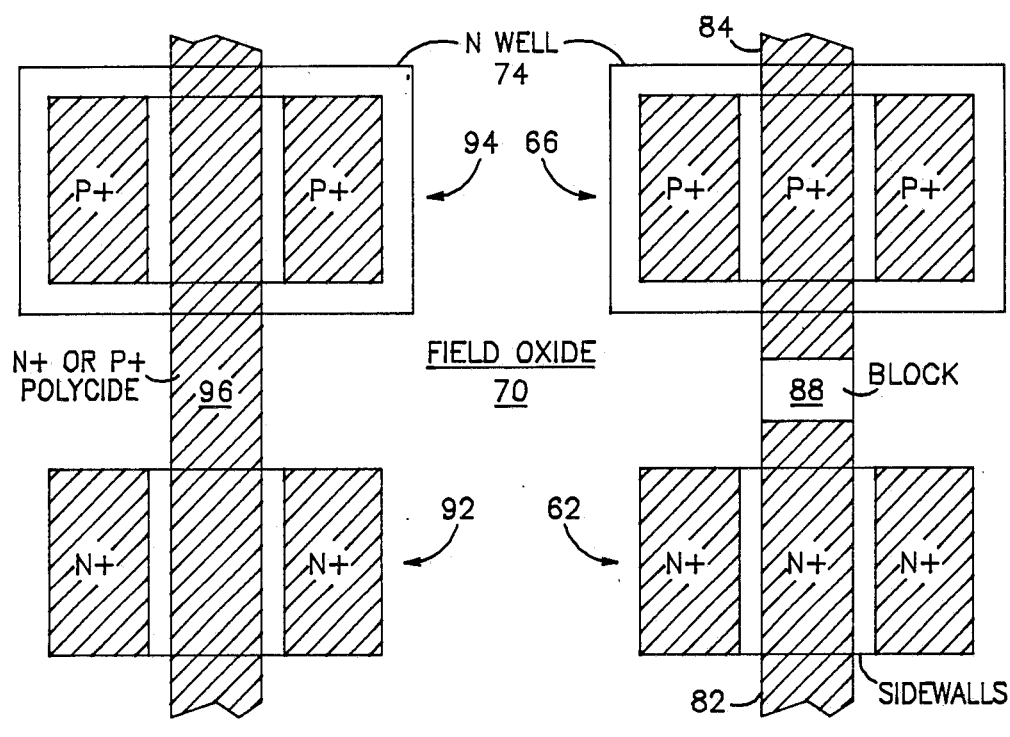
FIG. 7 is a plan or schematic layout of a circuit such as the one described illustrating a blocked and unblocked polysilicon gate line.

Shown in FIG. 7 is an overhead schematic illustration of the FETs 62, 66, 92 and 94 discussed above. Similar reference numbers are used for clarity. The use of the blocking element 88 is clearly shown between FETs 62 and 66, while it is absent between FETs 92 and 94.

Examples of how the doping concentrations may be adjusted to accomplish the desired purposes of the invention by the inventive procedures will now be discussed. In the first case, prior to the salicide formation, the source/drain implants may be designed to allow the arsenic dose to range from 1 to 2E16 atoms/cm$^2$ and the BF$_2$ dose to range from 2 to 4E15. The value of $V_{TPE}$, the threshold voltage for p-channel enhancement devices, is to be adjusted for the p+ poly gates. For n-channel and p-channel FETs with connected gates, without the silicide, $V_{TPE} = -0.7V$, whereas with the silicide strapping the poly, $V_{TNE} = +0.7V$ and $V'_{TPE} = -1.7V$. $V_{TNE}$ refers to the threshold voltage of an n-channel enhancement device. These conditions would provide a stronger pull-down to pull-up ratio circuit without having to re-size width/length (W/L) ratios of the n-channel or p-channel devices. $V'_{TPE}$ is adjusted via the arsenic counter-doping of p+ polysilicon gate to the n+ polysilicon gate.

In a second case, the arsenic concentration for the n+ source/drains ranges from 2 to 4E15, while the BF$_2$ concentration for the p+ source/drains ranges from 1 to 2E16. Here, the $V_{TNE}$ is adjusted for the n+ polysilicon gate. In the case without silicide, $V_{TNE} = +0.7V$, and in the case where the silicide strap is used over both types of gates, $V_{TPE} = -0.7V$ and $V'_{TNE} = +1.7V$. This configuration provides faster pull-up-to-pull-down ratio circuits.

Additional flexibility is obtained by adjusting an initial $V_T$ channel implant and As vs. BF$_2$ source/drain implants to provide depletion, enhancement or natural ($V_T$ of approximately 0V) device threshold voltages. For example, in the first case, the p-channel FET with a n+ polysilicon gate may have $V_{TP} = -0.7V$ with p- and n-channel devices connected with silicide. If the LTO mask option is chosen for the p-channel FET, that is, if a blocking element is used and cross-diffusion is not used between n- and p-doped gates, the $V_{TP}$ should be approximately equal to +0.3V and will provide higher current drive at the expense of additional static current drain.

Thus, the method of the invention provides a procedure for adjusting $V_T$ of devices late in the fabrication process, which is useful for providing quick turnaround for gate arrays, ASICs and other custom circuits. This can be done without additional channel doping, such as by implantation. The method can provide both enhancement, depletion and natural $V_T$ devices. These are useful in designing inverters. For example, a natural p-channel FET load can provide a faster pull-up, in turn dissipating DC power; $V_{TP}$ is approximately 0V. Further, a natural n-channel FET can be used as a passgate, trickler device, or in inverters; $V_{TN}$ would thus also be approximately 0V. Custom designed buffers with flexible switch/load $V_T$ design can be provided with either the rise time or the fall time as greater than the other, depending on the routing of the interconnect lines in the gate array.

The method of this invention may be advantageously employed in another specific application. Here the method provides p-channel FET enhancement devices, with $V_{TPE}$ equal to about $-0.5V$, and p-channel depletion devices, with $V_{TPD}$ equal to about +0.5V, for circuit design flexibility. In this application, no extra masking steps or channel implantations are required. A silicide strap is still employed to redistribute impurities between n+ and p+ polysilicon gates.

Figure 8:
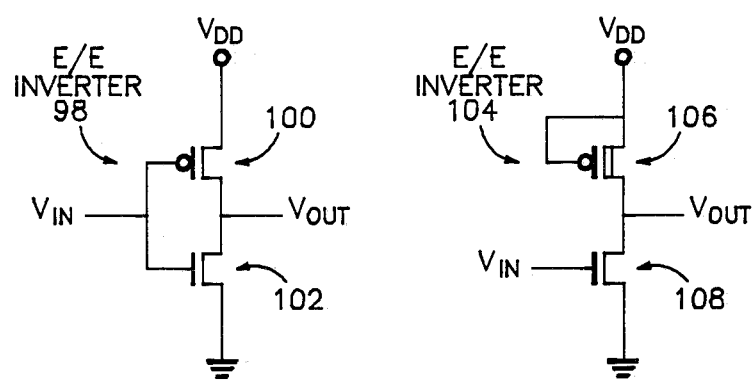
FIG. 8 is a schematic illustration of two known inverters to aid in a discussion of how the method of the present invention may be applied thereto.

Shown in FIG. 8 are known circuits for inverters. The enhancement/enhancement or E/E inverter 98 comprises a p-channel enhancement FET 100 and a n-channel enhancement FET 102. The gates of both FETs 100 and 102 are tied together at common $V_{in}$. The E/E inverter 98 has a low DC power consumption, permits multiple load elements, but makes poor NOR gates.

In turn, enhancement/depletion or E/D inverter 104 has a p-channel depletion FET 106 and a n-channel enhancement FET 108. Note that in E/D inverter 104, the p+ poly gate is tied to the p+ source of its own p-channel depletion device 106, not to the n+ gate of n-channel enhancement device 108. E/D inverter 104 dissipates DC power, but permits only one load element per gate, and thus provides good NOR gates. See James R. Pfiester, et al. "E/D CMOS—A High Speed VLSI Technology," 1983 *Symposium on VLSI Technology: Digest of Technical Papers*, 1983, pp. 44–45.

Conventionally, the p depletion $V_{TPD}$ is adjusted by a masked channel implant. However, in accordance with the method of this invention, lateral dopant diffusion in silicide between the differently doped gates of the E/E inverter 98 can be used to adjust $V_{TPE}$. Since in the E/E CMOS inverter 98, the p+ gate of FET 100 is tied to heavily n+ doped gate of n-channel FET 102, the p-channel FET 100 becomes an enhancement device with a n+ polysilicon gate. However, since in the E/D inverter 104 the p+ gate of the p-channel FET 106 is tied to its own p+ source, the FET 106 retains its p+ character and becomes a depletion device with $|V_{FB(n+)} - V_{FB(p+)}| = 1V$, where $V_{FB}$ is the flatband voltage the various devices.

An example of a process would be to design the p-enhancement device with the n+ poly gate, FET 100, as a buried-channel p-channel FET with $V_{TP} = -0.5V$ and 1.4E12 atoms/cm$^2$ at 30 keV boron channel implant, assuming the thickness of the gate oxide is 175 Angstroms. In this case, the arsenic source/drain dose would be much greater than the boron source/drain dose, for example an arsenic source/drain dose in the range of 1 to 2E16 and a boron source/drain dose in the range of 2.5 to 5E15. It should be recalled that these doses, like all of the doses employed herein are merely illustrative of a possible process and are not limiting to the invention. A silicide strap would be applied to the joined poly line in the manner described above. There would be no need for a blocking element on the E/D inverter circuit 104, since the p+ gate of FET 106 and the n+ gate of FET 108 would not be tied together by design. In general, altering the source/drain and channel implants can result in different $V_T$ combinations of n-channel and p-channel FETs depending on the gate connections. Or, the alteration can provide a means for changing the $V_T$ late in the IC wafer fabrication process.

In another alternate design, the BF$_2$ source/drain dose may be much greater than the arsenic source/drain dose. One would then design a buried-channel n-channel device 102 with $V_{TNC} = +0.7V$, where C refers to connected gate devices, with a p+ polysilicon gate using phosphorus or arsenic channel implants, which could be designed as a blanket implant for both n-channel and p-channel FET $V_T$ adjustment. The separated (S) n-channel FET 108 would have a n+ poly gate and $V_{TNS} = 0V$ to about $-0.3V$, to make it a "natural" device, and thus provide a stronger pull-down to pull-up ratio inverter.

I claim:

1. A process for fabricating field effect transistors (FETs) comprising the steps of: providing a silicon substrat having partially constructed FETs formed therein, each comprising a source, a drain, a channel region separating the source and drain, and a dielectric layer overlying at least the channel region; forming a patterned layer of polycrystalline silicon overlying the dielectric layer, the patterned layer including a first portion doped with an impurity of first conductivity type and a second portion doped with an impurity of second conductivity type, with a junction formed at the location where the first and second portions join; providing a blocking element overlying a selected portion of the patterned layer; forming a refractory metal silicide on the patterned layer including the junction, but not on that portion of the patterned layer having the blocking element thereover; and annealing to cause diffusion of impurities of first conductivity type from a first portion of the patterned layer through the refractory metal silicide to a second portion of the patterned layer doped with impurities of second conductivity type.

2. The process of claim 1 wherein an impurity is implanted into the polycrystalline silicon after the polycrystalline silicon pattern is formed and before the forming of the refractory metal silicide.

3. The process of claim 1 wherein at least one of the partially constructed FETs is isolated from dopant diffusion through the refractory metal silicide.

4. The process of claim 3 wherein isolation from dopant diffusion is provided by a blocking element on a common polysilicon gate line.

5. The process of claim 4 wherein the blocking element is a dielectric material.

6. The process of claim 5 wherein the blocking element is made from a dielectric material of the group comprising silicon nitride and silicon dioxide.

7. The process of claim 1 wherein the refractory metal in the refractory metal silicide is selected from the group consisting of titanium, molybdenum, tantalum, and tungsten.

8. The process of claim 1 wherein the impurities are selected from the group consisting of boron, phosphorus and arsenic.

9. A process for modifying the threshold voltages of selected field effect transistors (FETs) late in a fabrication process of the FETs comprising the steps of:
   providing a monocrystalline silicon substrate having partially constructed FETs formed therein, each comprising a source, a drain, a channel separating the source and drain, and a dielectric layer over at least the channel;
   forming a pattern of polycrystalline silicon gates on the dielectric layer positioned over the channels of the FETs, where a first portion of the pattern is doped with an impurity of a first conductivity type and a second portion of the pattern is doped with an impurity of a second conductivity type, wherein the joining of the first portions and second portions of the pattern occur at junctions;
   covering selected junctions with blocking elements;
   covering the polysilicon pattern and the junctions not covered by the blocking elements with a refractory metal silicide; and
   performing an anneal step to cause diffusion of the impurities in the first and second portions of the polysilicon pattern through the refractory metal silicide to the portion of the pattern having the opposite impurities over the junctions.

10. The process of claim 9 wherein an impurity is implanted into the polycrystalline silicon after the polycrystalline silicon pattern is formed and before the forming of the refractory metal silicide.

11. The process of claim 9 wherein the refractory metal is selectively formed on exposed polycrystalline silicon and monocrystalline silicon.

12. The process of claim 9 wherein the blocking elements are a dielectric material.

13. The process of claim 12 wherein the blocking elements are selected from a group of dielectric materials consisting of silicon nitride and silicon dioxide.

14. The process of claim 9 wherein the refractory metal in the refractory metal silicide is selected from the group consisting of titanium, molydenum, tantalum, and tungsten.

15. The process of claim 9 wherein the impurities are selected from the group consisting of born, phosphorus and arsenic.

16. A process for modifying the threshold voltages of selected field effect transistors (FETs) late in a fabrication process of the FETs comprising the steps of:

providing a monocrystalline silicon substrate having partially constructed FETs formed therewith, each comprising a source, a drain, a channel separating the source and drain, and a dielectric layer over at least the channel;

forming a pattern of polycrystallne silicon gates on the dielectric layer positioned over the channels of the FETs, where a first portion of the pattern is doped with an impurity of a first conductivity type and a second portion of the pattern is doped with an impurity of a seocnd conductivity type, wherein the joining of the first portions and second portions of the pattern occur at junctions;

covering the pattern of polycrystalline silicon gates with a layer of dielectric material;

selectively removing the dielectric material, leaving blocks of dielectric material on selected junctions;

selectively covering the polysilicon pattern and the junctions not covered by the blocking elements with a refractory metal silicide, not forming the silicide over the blocks; and performing an anneal step to cause diffusion of the impurities in the first and second portions of the polysilicon pattern through the refractory metal silicide to the portion of the pattern having the opposite impurities over the junctions, the diffusion being stopped by the blocks over selected junctions.

17. The process of claim 16 wherein the dielectric material of the blocking element is selected from the group consisting of silicon oxide and silicon nitride.

18. The process of claim 16 wherein the refractory metal in the refractory metal silicide is selected from the group consisting of titanium, molybdenum, tantalum, and tungsten.

19. The process of claim 16 wherein the impurities are selected from the group consisting of boron, phosphorus and arsenic.

* * * * *